United States Patent [19]

Kingston

[11] Patent Number: 4,808,939
[45] Date of Patent: Feb. 28, 1989

[54] VARIABLE RATE RECTANGULAR MATCHED FILTER

[75] Inventor: Samuel C. Kingston, Salt Lake City, Utah

[73] Assignee: Unisys Corporation, Blue Bell, Pa.

[21] Appl. No.: 177,284

[22] Filed: Apr. 4, 1988

[51] Int. Cl.$^4$ .......................... H03B 1/00; H03B 5/00; H04L 7/00
[52] U.S. Cl. .................................... 328/167; 328/151; 307/520; 375/103; 375/96
[58] Field of Search ............... 307/520, 521, 352, 353; 328/167, 151; 375/96, 94, 103; 333/173; 364/724, 825

[56] References Cited

U.S. PATENT DOCUMENTS 3,781,688 12/1973 Rannells ............................ 375/103

FOREIGN PATENT DOCUMENTS

87/01531 3/1987 World Int. Prop. O. .......... 375/103
87/07099 11/1987 World Int. Prop. O. .......... 375/103

Primary Examiner—Stanley D. Miller
Assistant Examiner—Timothy P. Callahan
Attorney, Agent, or Firm—John B. Sowell; Kevin R. Peterson; Thomas J. Scott

[57] ABSTRACT

A variable rate near perfect rectangular matched filter is provided with a low pass filter coupled to the input symbol data stream. The output of the filter is coupled to a sampler and the output of the sampler is coupled to an analog to digital converter to provide digital samples indicative of the data stream at a time occurring between input data symbols. The output of the analog to digital converter is applied to a digital adder which has a filter correction input factor to adjust the output of the digital adder so that the digital samples approximate very closely the output of a perfect rectangular matched filter.

12 Claims, 3 Drawing Sheets

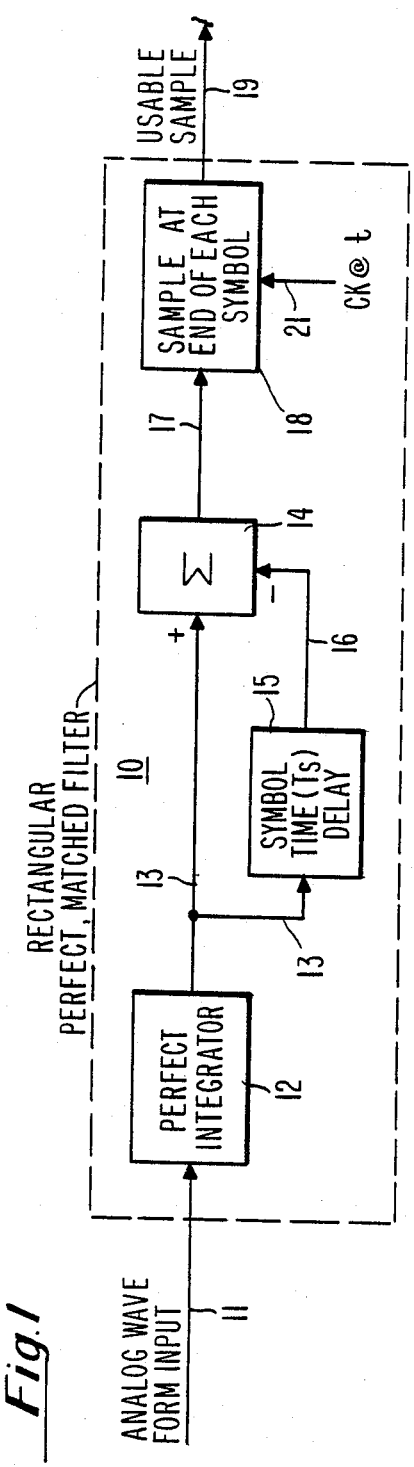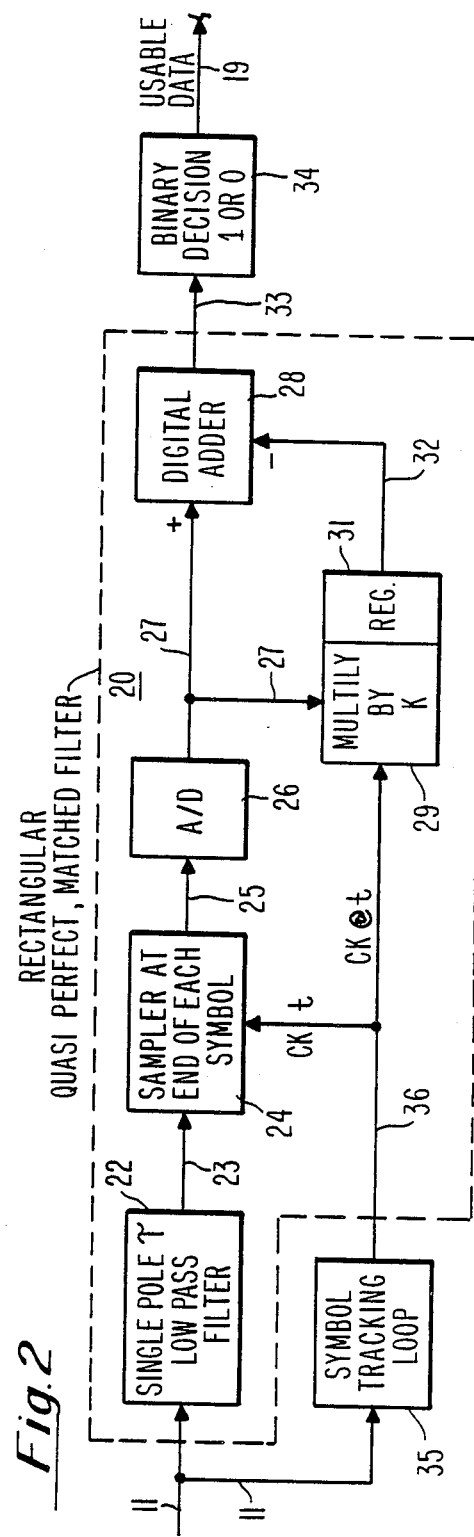

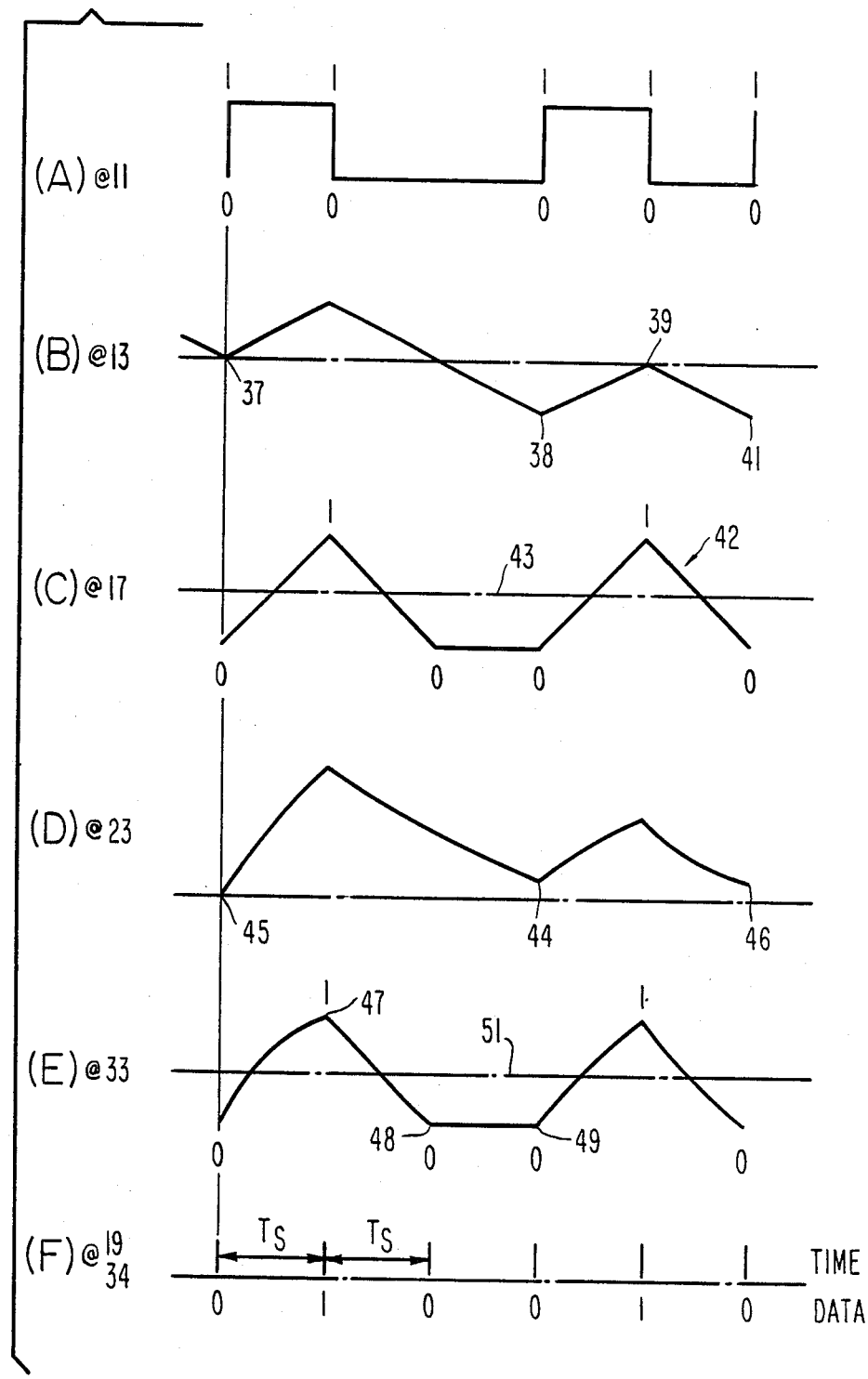

VARIABLE RATE RECTANGULAR MATCHED FILTER

BACKGROUND OF THE INVENTION

1. Field of the Invention

It is a principal object of the present invention to provide a variable rate rectangular matched filter. More particularly, it is an object of the present invention to provide a filter with a sampled output that closely represents the intregal of the input between samples and is operable in a circuit environment in place of a perfect matched filter.

2. Description of the Prior Art

Heretofore several different types of circuits were employed for increasing the signal to noise ratio of periodically keyed data. Such circuits are commonly recognized as being substitutes for perfect rectangular matched filters. A typical example of such circuit is known as an integrate and dump circuit which requires alternating storage and discharge buffers in order to provide continuous output indicative of a data stream. Such integrate and dump circuits are recognized to be basically analog devices and are designed to accommodate a fixed data rate.

Another form of substitute for a perfect matched filter is known as a lumped element filter which employs resistors, capacitors and inductive reactance elements to provide a rather complex analog arrangement which has the same shortcomings as the integrate and dump circuit but may be implemented in the form of a single filter. The lumped element filter is recognized as not being as accurate an estimate as the integrate and dump circuit is to a perfect rectangular matched filter and also is basically an analog device whose frequency is fixed according to the filter design.

Another form of substitute for a perfect matched filter is a tap delay line which is basically a fixed rate analog device which operates on the basic principle of accumulating a plurality of delayed outputs from a tap delay line. The summation of the delayed outputs provides the matched filtered substitute output.

There is an unmet requirement for a simple circuit structure which operates over a broad range of frequencies to provide a variable rate near perfect rectangular matched filter output.

SUMMARY OF THE INVENTION

It is a principal object of the present invention to provide a variable rate matched filter.

It is another principal object of the present invention to provide a novel near perfect matched filter that is operable in a circuit environment in place of a perfect rectangular matched filter.

It is another object of the present invention to provide a variable rate near perfect rectangular matched filter.

It is a general object of the present invention to provide a near perfect matched filter of the type which is less complicated than prior art substitutes for matched filters and provides a more accurate approximation of a matched filter than prior art devices over a range of variable frequency rates.

According to these and other objects of the present invention there is provided a quasi perfect matched filter which comprises a single pole low pass filter coupled to an analog waveform input. The output of the single pole low pass filter is coupled to a sampler and an analog to digital converter. The output of the analog to digital converter is applied to a digital adder which has a filter compensation factor input to provide a highly accurate matched filter output usable sample from the digital adder which may be utilized by different types of utilization devices.

BRIEF DESCRIPTION OF THE DRAWING

FIG. 1 is a block diagram of the basic elements which are employed to demonstrate an analog perfect rectangular matched filter for purposes of explaining the mode of operation of the present invention and for comparison to the present invention matched filter;

FIG. 2 is a block diagram of a digital variable rate near perfect rectangular matched filter of the present invention;

FIGS. 3A to 3F are waveforms showing the input and outputs to the circuits of FIGS. 2 and 3.

DESCRIPTION OF THE PREFERRED EMBODIMENT

Figure 4:
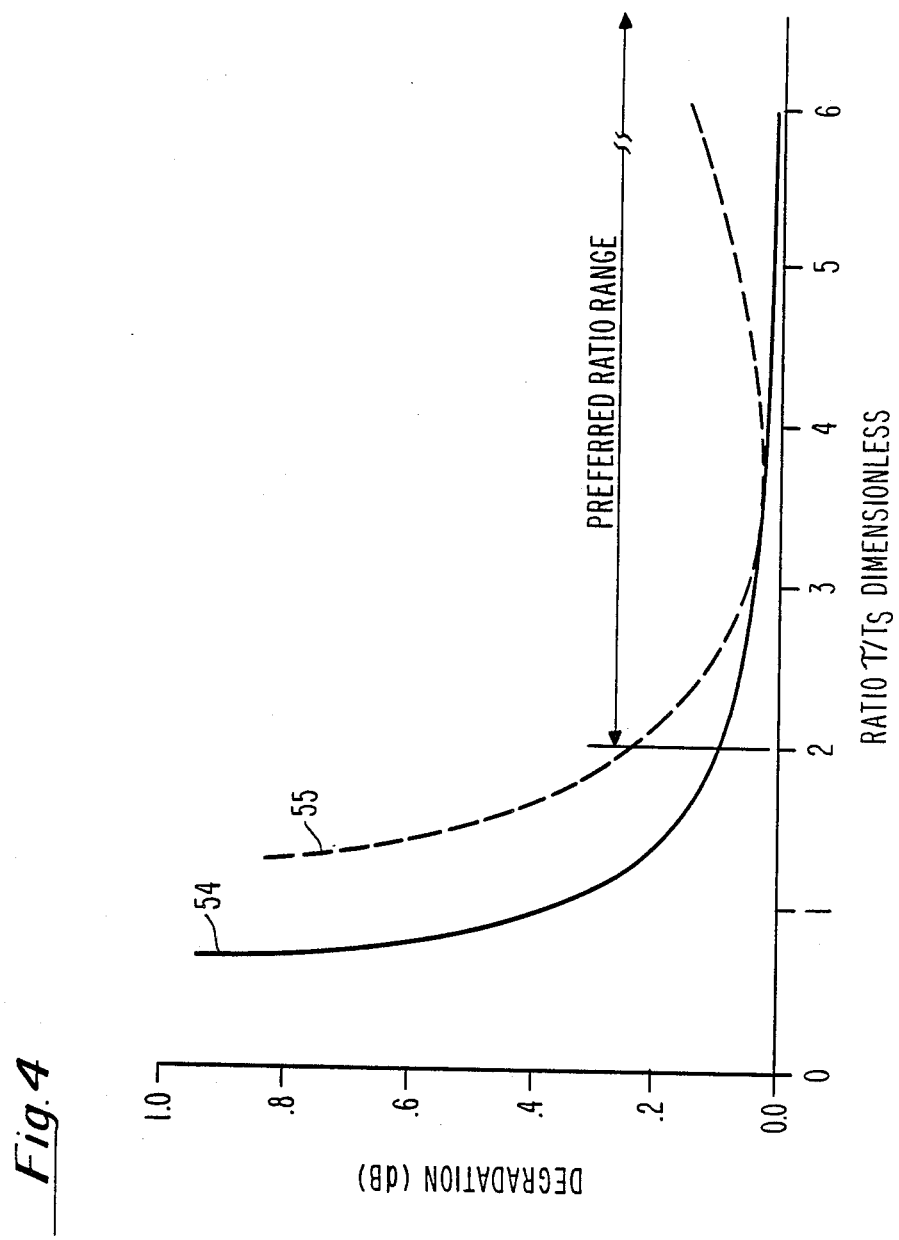
FIG. 4 is a curve showing the degradation or departure from a perfect matched filter performance incurred in the preferred embodiment of the present invention shown in FIG. 2.

Refer now to FIG. 1 showing a perfect matched filter block diagram. It is understood by those skilled in the art of designing filters that a perfect matched filter does not exist. However, it is possible to mathematically determine a perfect matched filter output for comparison with substitutes therefor. FIG. 1 shows a perfect matched filter 10 having an input 11 for receiving an analog waveform input, such as base band NRZ data, which is applied to a perfect integrator 12. The output of the perfect integrator 12 on line 13 comprises the integral from a long passed time period to the present time of the input waveform on line 11. The integrated data stream on line 13 is applied to the positive input of a summing circuit 14. The integrated data stream on line 13 is also applied to a symbol time delay $T_S$ which delays the data stream one symbol time ($T_S$). The delayed output on line 16 is applied to the negative input of summing circuit 14 to produce a perfect matched filter output on line 17 which may be sampled at the end of each symbol or symbol time by a clock pulse (t) occurring between symbols. The sampler 18 produces a usable sample on line 19 indicative of the matched filtered input on line 11. The clock on line 21 is adapted to identify the time threshold between the end of one symbol and the start of the next symbol. If the ideal or perfect rectangular matched filter 10 shown in phantom lines could be achieved by electronic circuitry there would no need for substitute circuits such as those used in the prior art and identified as integrate and dump circuits, lumped element filters and tapped delay lines.

Refer now to FIG. 2 showing a novel substitute for a perfect rectangular matched filter. The variable rate near perfect rectangular matched filter 20 is shown having the same analog waveform input at line 11 as that employed in FIG. 1. The phase shift key data on line 11 is applied to a single pole low pass filter of the type having a time constant $\tau$. Such filters are well known in the prior art and may be implemented with a single resistor and a capacitor for a passive filter and may employ an amplifier in active filter versions. The output of low pass filter 22 on line 23 is applied to a sampler 24 which takes an analog sample of the input signal at time t which is at the threshold between symbol time $T_S$. The analog output of sampler 24 on line 25 is applied to an analog to digital converter 26 to provide a digital output on line 27 which is applied to the positive input of a digital adder 28. The digital output on line 27 is also applied to a multiplier 29 which has a buffer register 31 that produces an output on line 32 which is applied to the negative input of digital adder 28 to produce a sample of the matched filter 20 output on line 33 which is here shown being applied to a utilization device identified as a binary decision block which identifies the sample as either a one or a zero at the time t which occurs between symbols. In order to synchronize the matched filter 20, the input data stream 11 can be applied to a symbol tracking loop 35 to produce a clock signal (t) between symbol times $T_S$ on line 36. The clocks or (t) time indicators on line 36 are applied to the sampler 24 and to the multiplier 29 and the register 31 to obtain instantaneous samples at the threshold point between symbols $T_S$ without regard to direction of the waveform. For purposes of the application illustrated herein, FIG. 2 represents a rectangular matched filter whose response to a pulse input is a rectangular output.

For purposes of illustrating the operation of the present invention quasi perfect matched filter 20 versus the theoretical operation of a perfect matched filter 10, refer now to FIG. 3 showing waveforms of the inputs and outputs of FIGS. 1 and 2. FIG. 3A shows a typical NRZ (non return to zero) waveform of the type applied to input line 11 of filters 10 and 20. The binary values zero and one are being applied at the transition points of the symbol times ($T_S$) for purposes of explaining the operation of the FIG. 1 and FIG. 2 circuits. Waveform FIG. 3B on line 13 assumes that the input data stream on line 11 has been a long series of zeros before the pulse waveform shown in FIG. 3A is applied on line 11. Thus, starting at time zero and at point 37, the waveform rises for the first symbol or transition time $T_S$, then reverses and starts downward linearally until a reversal or transient point occurs at point 38 causing a reversal. The waveform rises until the data stream again reverses at point 39 and stops at point 41 in the present illustration. The FIG. 3B waveform occurs on line 13 as an input to the summing circuit 14. The output of the summing circuit on line 17 is shown in FIG. 3C. The sampling points are taken at time t intervals which are shown marked with the binary data zero or one information. When the analog waveform 42 shown in FIG. 3C is sampled at the critical threshold points between symbols, the voltage sample will be ideally above or below the center or normal line 43, thus, identifying the binary magnitude of the data at the sample points as shown. The input data stream 11 will also contain white Gaussian noise and interference signal waveforms present with the data signal which may be of sufficient voltage magnitude to shift the points of interest beyond the center line 43 and cause bit errors.

Refer now to FIG. 3D showing the output waveform from single pole low pass filter 22 as a result of the input analog waveform on line 11 shown in FIG. 3A. It will be noted that the excursions between points of interest on the curve are no longer linear but have slight deviations from the perfect linearity shown in FIG. 3B. Output from filter 22 at point 44 is shown slightly above the starting point 45 which was forced to its lowest input point because of the assumption of the preceding long string of zeros otherwise point 44 would probably occur below point 45. It will be noted that point 46 is almost at the same level as point 44 but these differences do not affect the mode of operation of the novel near perfect rectangular matched filter at the output.

Refer now to FIG. 3E showing the waveform which would occur on output line 33 which would be seen if the sampler 24 was removed from the circuit. The purpose of removing the sampler 24 from the circuit is to provide a comparison between the matched filter 20 and the perfect matched filter 10. The FIG. 3E output illustrated at output line 33 from adder 28 is a very close approximation of the perfect matched filter output shown in FIG. 3C so if samples are taken at the transition points of the symbol times $T_S$ we should be able to make a binary determination with the same accuracy, or approximately the same accuracy as the perfect matched filter which is sampling almost the identical waveform after the summing circuit 14 shown in FIG. 1. Thus, the binary value of the waveform taken at point 47 is indicative of a value having a binary one for the time period $T_S$ preceding point 47 when the sample was taken. In similar manner, the binary value of the time preceding the sampling times at points 48 and 49 may be accurately determined to be binary zero by interpreting that the digital value of the waveform at points 48 and 49 is below the center reference value line 51.

FIG. 3F indicates time divisions for symbol times $T_S$ which separate the critical points on the waveforms shown in FIGS. 3A to 3E. The digital output or value shown below the time divisions $T_S$ is the binary decision, one or zero, made by block 34 to provide the usable data on output line 19 of FIG. 2.

Having explained the waveforms which occur at the input and output of the perfect matched filter 10 and the modified or near perfect rectangular matched filter 20 it will be understood that the binary decision may be made nearly as accurately with the embodiment of FIG. 2 as with the theoretical embodiment of FIG. 1. There is a degradation which occurs employing a single pole low pass filter having a real time constant $\tau$ because the perfect integrator 12 of filter 10 theoretically has a time constant of infinity. In the preferred embodiment of the present invention, the time constant $\tau$ of the single pole low pass filter 24 is preferably made to have a time constant of greater than two times, up to ten times, the symbol period $T_S$ to achieve the approximations and values to be illustrated hereinafter.

The k value employed in the mutiplier 29 to account for the degradation of the signal output from filter 22 can be determined accurately from the waveform discussed hereinafter. Refer now to FIG. 4 showing the degradation in decibels versus the ratio $\tau/T_S$ which is the ratio of the time constant of the filter 22 divided by the symbol time $T_S$. Preferably, the ratio $\tau/T_S$ is made greater than three and in the preferred ratio range shown in FIG. 4. Curve 54 shows that if the best value of k which is equal to $e^{-T_S/\tau}$ is used in multiplier 29, the degradation in decibel falls faster with a lower ratio of $\tau/T_S$ than if the ratio k is made a fixed value of 0.75 as shown in curve 55. In either event, if the design ratio of $\tau/t_S$ is made greater than three the degradation waveforms 54 and 55 are well below 0.2 decibels. However, the degradation in decibels of waveform 55 begins to rise above 0.2 decibel at somewhere around a ratio of six to seven indicating that it is best to employ a ratio between three and five for results which provide performance extremely close to an ideal matched filter.

Having explained a preferred embodiment of the present invention it is shown that digital filter 20 not only performs very close to an ideal or perfect matched filter but also maintains this range of performance over a broad range of input frequencies of the input data. The filter 20 is shown having a self-clocking or symbol tracking loop 35 which changes the clock rate t whenever the input data rate changes on input line 11. The other factor necessary to maintain quassi perfect performance and slight degradation shown in FIG. 4 is to maintain the ratio of $\tau/T_S$ in a preferred range so that the k factor in multiplier 29 maintained at the absolute best near perfect rectangular matched filter according to the present invention.

In contrast thereto the prior art devices used to approximate matched filters such as lumped element filters and tap delay lines all are designed for an extremely narrow range of frequencies and are not considered to be variable rate filters.

What is claimed is:

1. A variable rate quasi perfect matched filter comprising:
    a low pass filter coupled to a symbol data stream,
    sampler means coupled to the output of said low pass filter to provide samples of said symbol data stream at the end of each symbol time,
    analog to digital converter means coupled to the output of said sampler means to provide digital data sample output signals,
    filter correction means coupled to the output of said analog to digital converter means for compensating for degradation to the signals of the output of said low pass filter,
    digital adder means coupled to the output of said analog to digital converter means and to said filter correction means for providing matched filter output signals, and
    clock means coupled to the input symbol data stream for providing output clock signals at said sampler means and at said filter correction means and for adjusting the near perfect rectangular matched filter to variable input data rates.

2. A variable rate filter as set forth in claim 1 wherein said low pass filter comprises a single pole low pass filter.

3. A variable rate filter as set forth in claim 1 wherein said symbol data stream comprises base band data.

4. A variable rate filter as set forth in claim 1 wherein said clock means comprises a symbol tracking loop.

5. A variable rate filter as set forth in claim 1 wherein said filter correction means comprises a digital multiplier.

6. A variable rate filter as set forth in claim 5 wherein said digital multiplier is adapted to multiply the output of said analog to digital converter means by predetermined factor k.

7. A variable rate filter as set forth in claim 6 wherein said predetermined factor k is fixed.

8. A variable rate filter as set forth in claim 7 wherein said predetermined factor k is 0.75.

9. A variable rate filter as set forth in claim 6 wherein said predetermined factor k is equal to $e^{-T_S/\tau}$ $T_S$ is the symbol data time period and $\tau$ is the time constant of said low pass filter.

10. A variable rate low pass filter as set forth in claim 9 wherein $T_S/\tau$ is greater than two.

11. A variable rate filter as set forth in claim 10 wherein $T_S/\tau$ is between two and ten.

12. A variable rate filter as set forth in claim 2 which further includes binary decision means coupled to the output of said digital adder means for converting the digital samples to digital data indicative of the input symbol data stream.

* * * * *